US005322757A

United States Patent [19]
Ebersole

[11] Patent Number: 5,322,757
[45] Date of Patent: Jun. 21, 1994

[54] POSITIVE PHOTORESISTS COMPRISING A NOVOLAK RESIN MADE FROM 2,3-DIMETHYL PHENOL,2,3,5-TRIMETHYLPHENOL AND ALDEHYDE WITH NO META-CRESOL PRESENT

[75] Inventor: Charles E. Ebersole, Cheshire, Conn.

[73] Assignee: OCG Microelectronic Materials, Inc., West Paterson, N.J.

[21] Appl. No.: 37,488

[22] Filed: Mar. 24, 1993

Related U.S. Application Data

[63] Continuation of Ser. No. 405,802, Sep. 8, 1989, abandoned.

[51] Int. Cl.$^5$ .................. G03F 7/023; G03F 7/30
[52] U.S. Cl. .................. 430/192; 430/165; 430/191; 430/193; 528/155
[58] Field of Search .............. 430/191, 192, 193, 165; 528/153

[56] References Cited

U.S. PATENT DOCUMENTS

| | | | |
|---|---|---|---|
| 4,173,290 | 11/1979 | Kobayashi et al. | 220/75 |
| 4,404,357 | 9/1983 | Taylor et al. | 528/153 |
| 4,451,550 | 5/1984 | Bennett et al. | 430/191 |
| 4,529,682 | 7/1985 | Toukhy | 430/190 |
| 4,719,167 | 1/1988 | Miura et al. | 430/192 |
| 4,725,523 | 2/1988 | Miura et al. | 430/192 |
| 5,059,507 | 10/1991 | Uetani et al. | 430/192 |
| 5,124,228 | 6/1992 | Uetani et al. | 430/192 |

FOREIGN PATENT DOCUMENTS

| | | |
|---|---|---|
| 0227487 | 12/1986 | European Pat. Off. . |
| 0239423 | 3/1987 | European Pat. Off. . |
| 227487 | 7/1987 | European Pat. Off. . |
| 239423 | 9/1987 | European Pat. Off. . |
| 335220 | 10/1989 | European Pat. Off. ............ 430/192 |
| 55-126250 | 9/1980 | Japan . |
| 60-158440 | 8/1985 | Japan . |
| 60-164740 | 8/1985 | Japan . |
| 60-176034 | 9/1985 | Japan . |
| 62-89040 | 4/1987 | Japan . |

OTHER PUBLICATIONS

Solid State Technology, Jun. 1984, pp. 115–120, T. R. Pampalone "Novolac Resins Used in Positive Resist Systems".
Chen and Rice "Study of Dryout Resistance of Phenolic Copolymer Resins for Pine Plywood Glues—Parts I & II" Forest Products Journal vol. 24, No. 3.
Solid State Technology, Jun. 1984, pp. 115–120, T. R. Pampalone "Novolac Resins Used in Positive Resist Systems".
English language abstract of Japanese Publication #62-163,055, Published Jul. 18, 1987 (Mitsubishi Chem.).
English language abstract of Japanese Publication #62-89,040, dated Apr. 23, 1987.
Rice et al., "Study of Dryout Resistance of Phenolic Copolymer Resins for Pine Plywood Glues—Parts I and II", Forest Products Journal, Mar., 1974.
English language abstract of Japanese Publication #60-164,740, Published Aug. 27, 1985, (Hosaka et al.).
English language abstract of Japanese Publication #60-176,034 Published Sep. 10, 1985, (Hosaka et al.).
English language abstract of Japanese Publication #55-126,250, Published Sep. 29, 1980, (Fuji Photo Film).
English language abstract of Japanese Publication #158,440, Published Aug. 19, 1985, (Mitsubishi Chem. Ind. K.K.).
English language abstract of Europe Publication #136,110, Published Apr. 3, 1985 (Miura et al.).
English language abstract of Japanese Publication #62-89,040, Published Apr. 23, 1987, (Miura et al.).

*Primary Examiner*—Charles L. Bowers, Jr.
*Assistant Examiner*—John S. Chu
*Attorney, Agent, or Firm*—William A. Simons

[57] ABSTRACT

Improved photoresist compositions having high resolution and high thermal resistance, produced from certain novolak polymers and diazoquinone photosensitizers. The useful novolak polymers are formed from phenolic mixtures including 2,3,5-trimethyl phenol and/or 2,3-dimethyl phenol, and optional amounts of 2,6-dimethyl phenol, o-cresol and p-cresol.

9 Claims, No Drawings

POSITIVE PHOTORESISTS COMPRISING A NOVOLAK RESIN MADE FROM 2,3-DIMETHYL PHENOL,2,3,5-TRIMETHYLPHENOL AND ALDEHYDE WITH NO META-CRESOL PRESENT

This application is a continuation of application Ser. No. 07/405,802, filed Sep. 8, 1989, now abandoned.

BACKGROUND OF THE INVENTION

1. Field of the Invention

The present invention relates to novel positive photoresist compositions based upon certain novolak polymers and containing diazoquinone-type photosensitizers. More specifically the invention relates to positive photoresist compositions which provide high resolution and high resistance to flow at elevated temperatures.

2. Description of Related Art

Photoresist compositions are used in microlithographic processes for making miniaturized electronic components, such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate In some processes, it is desirable to bake the imaged resist coating before this developing step. This intermediate step is sometimes called post-exposure bake or PEB.

Photoresist compositions may be negative-working or positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. the Wolff rearrangement reaction of the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

Positive-working photoresist compositions are currently favored over negative-working resists because the former generally have better resolution capabilities and pattern transfer characteristics.

After this development operation, the now partially unprotected substrate may be treated with a substrate-etchant solution or plasma gases and the like. This etchant solution or plasma gases etch the portion of the substrate where the photoresist coating was removed during development. The areas of the substrate are protected where the photoresist coating still remains and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Certain uses of photoresists require that the photoresist formulations possess better lithographic properties for the fabrication of smaller microelectronic circuits. The lithographic properties which are critical to these uses include the following: (1) good resolution capabilities in both the micron and submicron ranges without incomplete development in the exposed areas (i.e. scumming); (2) higher thermal image deformation temperatures (e.g. above 120° C.); (3) relatively fast photospeeds; (4) good adhesion to the substrate; (5) good developer dissolution rates; (6) good process latitude; (7) near to absolute vertical profiles (or good contrast) between exposed and unexposed photoresist areas after development; (8) good resistance to etching solutions and plasma etching techniques; (9) reduced tendency to form insoluble particulates and (10) mask linearity.

Generally, past efforts to improve one of these lithographic properties have resulted in significant decreases in one or more of the other lithographic properties of the photoresist. Accordingly, there is a need for improved photoresist formulations which possess all of these desired properties. The present invention is believed to be an answer to that need.

It is known to prepare positive photoresist compositions from novolak polymers and photosensitizers such as naphthoquinone diazide, such novolak polymers being formed by reacting a combination of m-cresol and p-cresol with formaldehyde in the presence of an acid catalyst. However such positive photoresist compositions do not demonstrate high resolution with high thermal resistance, due to the formation of isomer and oligomer mixtures as undesirable by-products. Reference is made to U.S. Pat. No. 4,529,682 (Hunt Chemical).

A large number of dimethyl phenol novolak compositions are known in the art. Reference is made to Japanese published patent applications J 60176034-A (JSR); J 60158440-A (Mitsubishi Chemical) and JP 62/89042-A2 (Mitsubishi Chemical). These references disclose the incorporation of p-cresol and/or m-cresol into their compositions as required ingredients. Such cresols result in the formation of by-products including isomers, such as p-cresol dimer, and oligomers, which reduce the resolution and thermal resistance of the compositions.

SUMMARY OF THE INVENTION

The present invention is based upon the discovery that novel positive photoresist compositions having high resolution and high thermal resistance can be produced from certain novolak polymers and diazoquinone photosensitizers, said novolak polymers being formed from phenolic mixtures including 2,3,5-trimethyl phenol and/or 2,3-dimethyl phenol, and optional amounts of 2,6-dimethyl phenol, o-cresol and p-cresol. The present novolak polymer compositions preferably do not contain m-cresol as a phenolic reactant.

Thus, the present novolak polymers are produced by reacting, instead of m/p-cresols, a mixture of 2,3,5-trimethyl phenol and/or 2,3-dimethyl phenol alone or in combination with 2,6-dimethyl phenol, p-cresol and o-cresol with a suitable aldehyde, such as formaldehyde, under conventional novolak-making conditions, generally the presence of an acid catalyst. The resulting polymers have a molecular weight within the range of from about 1000 to 6000, a high softening point, above about 140° C., and a very viscous melt flow. When such novolak, polymers are formulated into resist compositions containing diazoquinone photosensitizers such as disclosed in U.S. Pat. No. 4,529,682, as a replacement for the novolak polymers thereof, such resist compositions exhibit high resolution and high resistance to flow at elevated temperatures. These properties, coupled with the exceptional and unexpected behavior of 2,3,5-trimethyl phenol as a hydrophobic component replacing cresols such as p-cresol, result in photoresist formulations having exceptional lithographic properties for fabrication of smaller microelectronic circuits.

The following examples are illustrative of the production of novolak polymers useful according to the present invention.

EXAMPLE 1

A one liter three neck flask was fitted with a thermometer and a phenolic mixture comprising 51% by weight of 2,3,5-trimethyl phenol, 45% by weight of o-cresol and 4% by weight of 2,6-dimethyl phenol was introduced to the flask containing an aqueous or organic solvent, preferably water, and an acid catalyst, preferably oxali acid. Next an amount of formaldehyde, about equal to the molar amount of the phenolic compounds, is added. The mixture is heated to a temperature between about 60° C. and 120° C. for between about 3 and 20 hours to form the novolac polymer having a molecular weight of about 3123 and a softening point of about 174° C.

EXAMPLE 2

Example 1 is repeated with a different phenolic mixture comprising 30% by weight of 2,3,5-trimethyl phenol, 50% by weight of 2,3-dimethyl phenol, 12% by weight of o-cresol and 8% by weight of 2,6-dimethyl phenol, using a similar substantially eqimolar amount of formaldehyde and similar reaction conditions, to form a similar novolak polymer having a molecular weight of about 3008 and a softening point of about 186° C.

The following examples are illustrative of resist compositions and their use according to the present invention.

EXAMPLE 3

A resist solution was produced by dissolving 8.25 grams of the novolak polymer of Example 1 and 2.75 grams of a naphthoquinone sensitizer comprising trihydroxybenzophenone esterified with 1.4 equivalents of 2,1,5-diazonaphthoquinone in a solvent comprising ethyl cellosolve acetate.

Bare silicon wafers were coated and softbaked at 100° C. for 60 sec to 1.2 micron film thickness. These were exposed on a Canon PLA 501f contact aligner in the broad band mode using an optiline mask. The latent image was developed using HPRD-402 developer in the puddle mode. The image formed at the 60% transmission step revealed 0.6 micron lines under SEM observation.

EXAMPLE 4

A resist solution was produced by dissolving 8.25 grams of the novolak polymer of Example 2 and 2.75 grams of the naphthoquinone sensitizer of Example 3 in 29 grams of solvent comprising ethyl cellosolve acetate.

Bare silicon wafers were coated and softbaked at 100° C. for 60 sec to 1.2 micron film thickness. These were exposed on a Canon PLA 501f contact aligner in the broad band mode using an optiline mask. The latent image was developed using HPRD-402 developer in the puddle mode. The image formed at the 60% transmission step revealed 0.6 micron lines under SEM observation.

EXAMPLE 5

A resist solution was prepared by dissolving 8.25 grams of the novolak polymer of Example 2 and 2.75 grams of a naphthoquinone sensitizer comprising 2,3,4,4,-tetrahydroxy benzophenone esterified with 2.75 equivalents of 2,1,5-naphthoquinone diazide in 29 grams of solvent comprising ethyl cellosolve acetate.

Bare silicon wafers were coated and softbaked at 100° C. for 60 sec to 1.2 micron film thickness. These were exposed on a Canon Stepper with a 0.45 NA at 405 nm using a Standard screening reticle. The latent image was developed using 0.261 N TMAH for 60 sec. in the puddle mode. The images formed were subjected to various temperatures for a 4 min. on a hotplate. Minimal deformation of the images adjacent to bulk areas was noted up to 135° C.

The foregoing examples are illustrative only and should not be considered limitative.

For example, the content of the 2,3,5-trimethyl phenol in the phenolic mixture can vary between about 0% and 60% by weight, preferably between about 20% and 60% by weight; the content of the 2,3-dimethyl phenol can vary between about 0% and 95% by weight, provided that at least about 2% by weight of either the 2,3,5-trimethyl phenol or the 2,3-dimethyl phenol is present, the content of the optional 2,6-dimethyl phenol can vary between 0% and 15% by weight, and the content of the optional p-cresol and o-cresol can vary between about 0% and 60% each by weight. Also other aliphatic aldehydes may be used in place of formaldehyde, such as acrolein and other related aldehydes conventionally used in the novolak resin art. The aldehyde is reacted with the phenolic compounds in a molar amount between 0.9 and 1.15 per mole of total phenolic compounds present.

Similarly the resist compositions generally contain from about 10% to 30% by weight of the novolak polymer, from about 3 to 15% by weight of the sensitizer and from about 65% to 80% by weight of the solvent. Generally, in terms of solids content, the resin compositions contain between 60 and 95% by weight of the novolak resin and between 5 and 40% by weight of the photosensitizer. Also other conventional ingredients may be present including other phenol-aldehyde polymers, additional photosensitzers, different solvents, dyes, anti-striation agents, plasticizers, speed enhancers and similar conventional additives.

While specific components of the present system are defined above, many other variables may be introduced which may in any way affect, enhance or otherwise improve the system of the present invention. These are intended to be included herein.

Although variations are shown in the present application, many modifications and ramifications will occur to those skilled in the art upon a reading of the present disclosure. These, too, are intended to be included herein.

What is claimed is:

1. A positive resist composition comprising an admixture of, on a solids basis, about 60% to about 95% by weight of novolak resin and about 5% to about 40% by weight of diazoquinone sensitizer; said novolak resin formed by the reaction of a phenolic mixture with aldehyde and wherein said phenolic mixture contains, based on the total weight of phenolic compounds present therein, from about 2% to about 60% by weight 2,3,5-trimethylphenol and about 2% to about 95% by weight of 2,3-dimethylphenol and contains no meta-cresol.

2. The positive resist composition of claim 1 wherein said phenolic mixture contains, based on the total weight of phenolic compounds present therein, from about 20% to about 60% by weight of 2,3,5-trimethylphenol.

3. The positive resist composition of claim 1 wherein said phenolic mixture further contains, based on the total weight of phenolic compounds present therein, up to 15% by weight of 2,6-dimethylphenol.

4. The positive resist composition of claim 1 wherein said phenolic mixture further contains, based on the total weight of phenolic compounds present therein, up to 60% by weight of p-cresol.

5. The resist composition of claim 1 wherein said phenolic mixture further contains, based on the total weight of phenolic compounds contained therein, up to about 60% by weight of o-cresol.

6. The positive resist composition of claim 1 wherein said novolak resin has a molecular weight between about 1,000 to 6,000.

7. The positive resist composition of claim 1 wherein said novolak resin has a softening point above about 140° C.

8. The positive resist composition of claim 1 wherein the molar ratio of aldehyde to phenolic mixture is from about 1:1 to about 1.15:1.

9. The positive resist composition of claim 1 wherein said diazoquinone comprises 2,1,5-diazonaphtoquinone.

* * * * *